(12) United States Patent
Premutico et al.

(10) Patent No.: US 9,384,691 B2
(45) Date of Patent: Jul. 5, 2016

(54) TRANSPARENT DISPLAY AND ILLUMINATION DEVICE

(71) Applicant: Universal Display Corporation, Ewing, NJ (US)

(72) Inventors: Mauro Premutico, Brooklyn, NY (US); Ruiqing Ma, Morristown, NJ (US); Michael Hack, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/049,468

(22) Filed: Oct. 9, 2013

(65) Prior Publication Data

US 2014/0139458 A1    May 22, 2014

Related U.S. Application Data

(63) Continuation-in-part of application No. 13/656,188, filed on Oct. 19, 2012, and a continuation-in-part of application No. 13/912,961, filed on Jun. 7, 2013, which is a continuation-in-part of application No. 13/656,188, filed on Oct. 19, 2012.

(51) Int. Cl.
*H01L 29/08*    (2006.01)
*G09G 3/32*    (2016.01)
*H01L 27/32*    (2006.01)
*H01L 51/52*    (2006.01)

(52) U.S. Cl.
CPC .......... *G09G 3/3208* (2013.01); *H01L 27/3223* (2013.01); *G09G 2300/023* (2013.01); *H01L 27/3267* (2013.01); *H01L 51/5225* (2013.01); *Y10T 29/49002* (2015.01)

(58) Field of Classification Search
CPC .................. H01L 27/3223; H01L 27/3267
USPC ......................................................... 257/40
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo et al., "Highly efficient phosphorescent emission from organic electroluminescent devices", Nature, vol. 395, pp. 151-154, 1998.

(Continued)

*Primary Examiner* — Douglas Menz
(74) *Attorney, Agent, or Firm* — Morris & Kamlay LLP

(57) ABSTRACT

A transparent emissive device is provided. The device may include one or more OLEDs having an anode, a cathode, and an organic emissive layer disposed between the anode and the cathode. In some configurations, the OLEDs may be non-transparent. The device may also include one or more locally transparent regions, which, in combination with the non-transparent OLEDs, provides an overall device transparency of 5% or more. The device also may include a double-sided display capable of displaying different, identical, or related images on each side of the device.

29 Claims, 8 Drawing Sheets

(56) References Cited

U.S. PATENT DOCUMENTS

| | | |
|---|---|---|
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,664,173 B2 | 12/2003 | Doyle et al. |
| 7,279,704 B2 | 10/2007 | Walters et al. |
| 7,431,968 B1 | 10/2008 | Shtein et al. |
| 7,968,146 B2 | 6/2011 | Wagner et al. |
| 2003/0230980 A1 | 12/2003 | Forrest et al. |
| 2004/0174116 A1 | 9/2004 | Lu et al. |
| 2013/0135328 A1 | 5/2013 | Rappoport et al. |

OTHER PUBLICATIONS

Baldo et al.,"Very high-efficiency green organic light-emitting devices based on electrophosphorescence", Applied Physics Letter, vol. 75, No. 1, pp. 4-6, 1999.

TRANSPARENT DISPLAY AND ILLUMINATION DEVICE

PRIORITY

This application is a continuation-in-part of U.S. application Ser. No. 13/656,188, filed Oct. 19, 2012, and a continuation-in-part of U.S. application Ser. No. 13/912,961, filed Jun. 7, 2013, which is a continuation-in-part of U.S. application Ser. No. 13/656,188, filed Oct. 19, 2012, the disclosure of each of which is incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to OLEDs and, more specifically, to OLED devices that are transparent and emit light primarily or entirely through a single surface.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

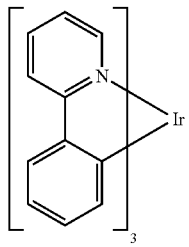

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

OLED devices and method of fabricating the same are provided. The devices include emissive regions and locally-transparent regions, such that the device has an overall transparency of at least 5%.

In an embodiment of the invention disclosed herein, a device may include a light emitting surface with a first region and a second region, where the device transmits light through the first region and emits light from the second region, and has an overall device transparency of at least 5%, at least 10%, or more. The device may be, for example, a display such as a full-color display, an OLED display, an AMOLED display, a flexible OLED display, or the like. The second region may have a higher local transparency than the first region, for example where the local transparency of the region is less than 5%, less than 1%, or less. The device may include multiple OLEDs configured to emit light through the first surface, which may be arranged to emit light only or primarily through the first region of the light emitting surface. The OLEDs may occupy not more than about 75% of the total area of the display. At least 70% of the area of the display not occupied by the plurality of OLEDs may have a local transparency of at least 25%, 50%, or more. The device may be divided into regions, each of which includes at least one OLED and a transparent region having a local transparency of at least 25%. Overall, such transparent regions may occupy at least 25% of the total area of the light emitting surface. In some configurations the OLED devices may include a white emitting device and/or one or more color filters. The device may be flexible, and may be fabricated on, for example, a plastic substrate. It also may include additional layers, such as protective layers, including a single layer barrier encapsulation layer, which may be disposed over the light emitting surface or another surface of the device.

In an embodiment of the invention disclosed herein, an OLED device may include two electrodes having different surface areas, where the surface area of one is not more than about 80% of the surface area of the other, and an emissive layer disposed between the electrodes. The OLED device may be configured to emit light only through one electrode. Alternatively or in addition, multiple electrodes may be disposed on one side of the emissive layer, which have a combined surface area of not more than about 80% of the surface area of the other electrode. The device may have an overall transparency of at least 5%, 10%, or more. It may include an OLED, an AMOLED, a flexible OLED, one or more color filters or filter layers, a flexible substrate such as a plastic substrate, a protective layer such as a single layer barrier encapsulation, or the like.

In an embodiment of the invention, a method of fabricating a device as disclosed herein is provided. The method may include, for example, depositing an anode material over a substrate having a transparency of at least 5%, to form a patterned layer that covers a first portion of the substrate and does not cover a second portion of the substrate, depositing an emissive layer over the first portion and the second portion of the substrate, and depositing a cathode material over the first portion and the second portion of the substrate. Such a method also may use appropriate substrates, emissive layers, control components, and other components as disclosed herein. The resulting device may have an overall transparency of 5%, 10%, or more.

In an embodiment, a device may include a light emitting first device having a first region and a second region, where the first device transmits light through the first region and a first surface of the first device emits light from the second region, and where the device has an overall transparency of at least 5%. A second surface of the first device may emit light from the second region. The second region of the second surface may include a single-pixel OLED, and the second region may substantially surround at least a portion of the first region. The first surface provides a full-color display, and the second surface may provide general illumination.

In an embodiment, the second region may have a local transparency of less than 5%, less than 1%, or the like. The device may have an overall transparency of at least 10%. The second region may have a local transparency of less than 5%, less than 1%, or less, and the device an overall transparency of at least 10%.

In an embodiment, a device may include a first plurality of OLEDs, each of which is configured to emit light from the first surface of the second region. Further, each of the first plurality of OLEDs may emit light only from the second region. The first plurality of OLEDs may occupy not more than about 75% of the total area of the display surface. The device may include a second plurality of OLEDs, each of which emits light from the second surface of the second region. In an embodiment, the OLEDs that emit light from the first and second surfaces may be independently controllable, and/or emit different spectra.

In an embodiment, at least 70% of the area of the display not occupied by the first plurality of OLEDs may have a local transparency of at least 25%, at least 50%, or more.

In an embodiment, a device may include a plurality of regions, each of which includes one or more of the first plurality of OLEDs and transparent region having a local transparency of at least 25%. Each of the plurality of regions also may include one or more of the second plurality of OLEDs.

In an embodiment, a device as disclosed also may include a camera. In some cases, the device may include an OLED configured to emit light from a second surface of the device, which may emit light at a non-visible wavelength such as in the infrared portion of the spectrum. The device may be capable of displaying an image captured by the camera using the non-visible wavelength light, for example to produce an information-rich and/or heads-up style display.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
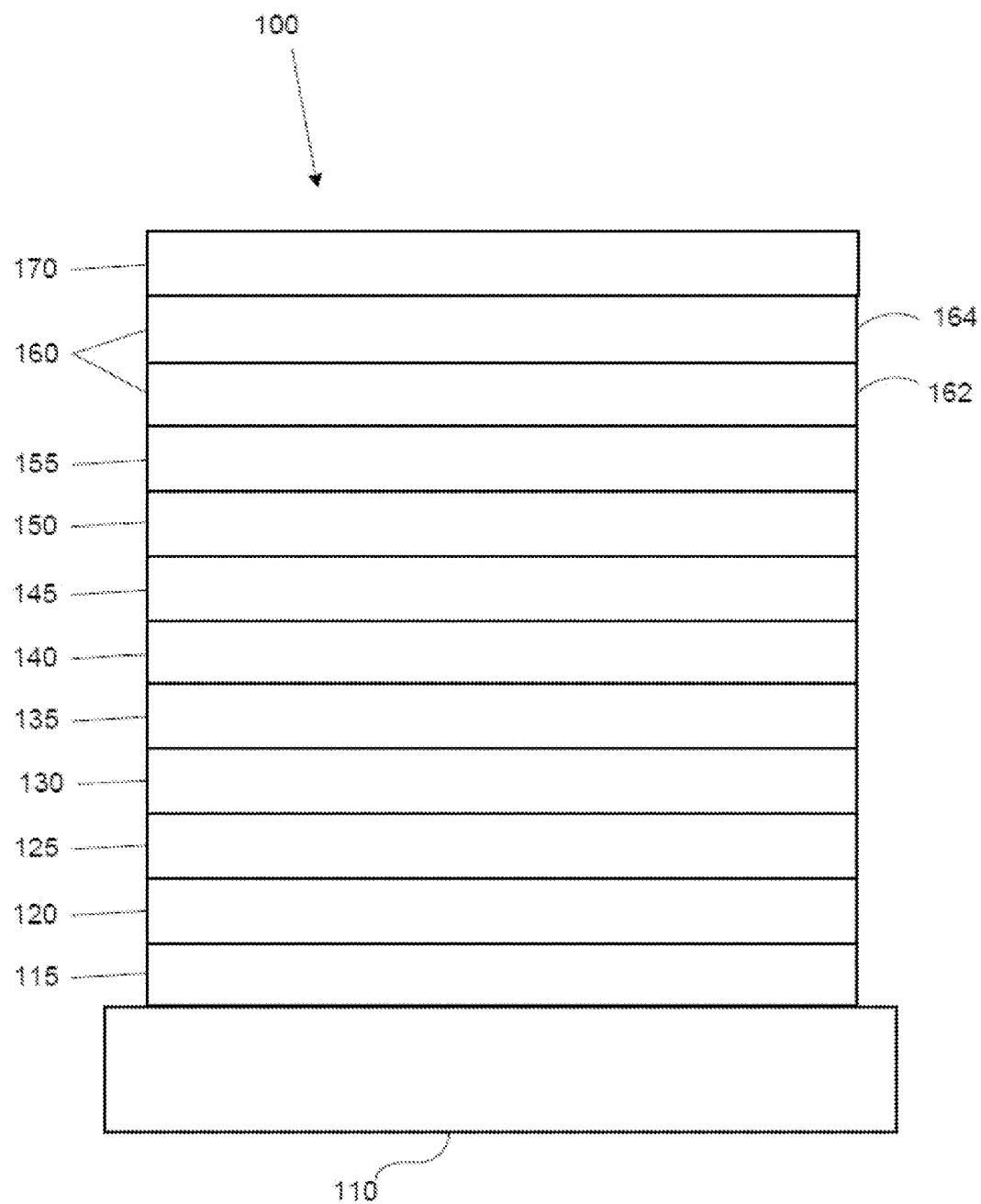
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
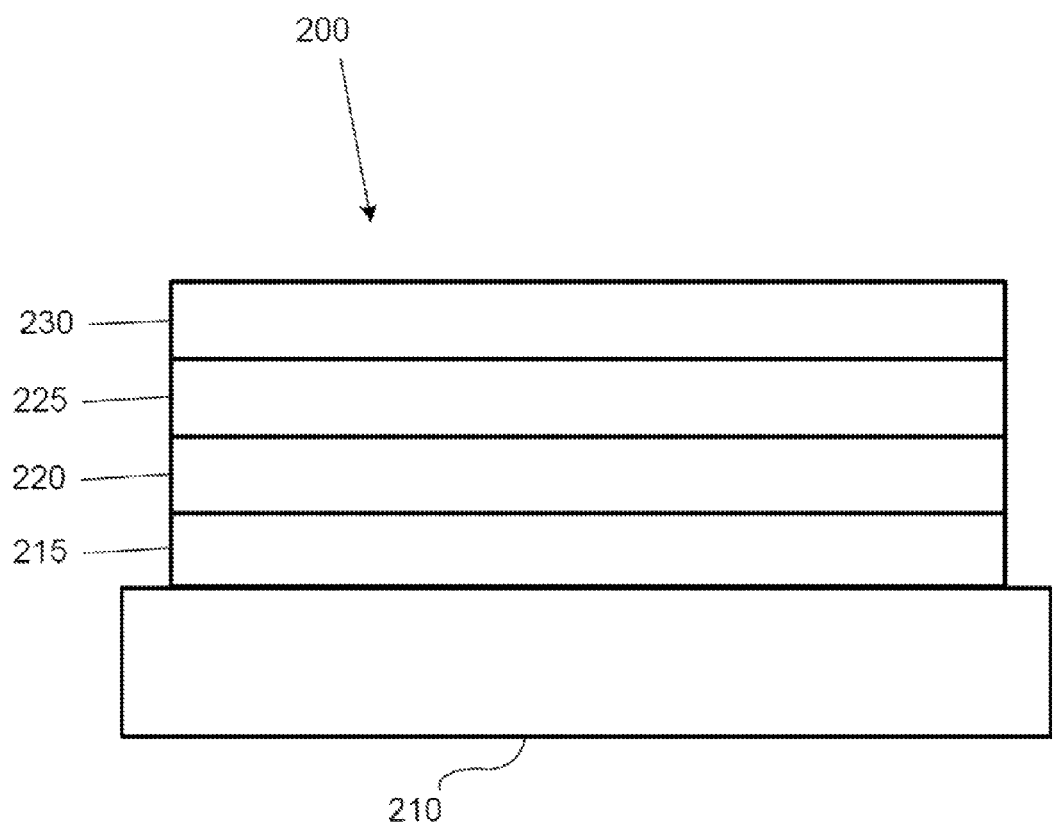
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, 3 dimensional displays (3D displays), laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

In a conventional OLED display, it is common to try to maximize the fill factor or pixel aperture ratio, that is, the fraction of display surface or pixel-covered area that emits light. This typically may reduce the current density required to be applied to the active OLED devices to achieve a desired performance, and thus extend device lifetimes.

Transparent OLEDs (TOLEDs) have been demonstrated where the basic OLED device is effectively transparent, and which emit light through both the anode and cathode surfaces. Such devices typically may be constructed by using a transparent cathode combined with the commonly used transparent anode. Conventional TOLED displays also may use semi-transparent cathodes, which can be more difficult than metal cathodes to make in mass production as they may rely on a relatively high uniformity of thin films used during fabrication.

In some cases it may be desirable to use a TOLED that emits light in only one direction, while the overall display remains relatively transparent or partially transparent. Various TOLED arrangements have been demonstrated that emit only in one direction by using filters or polarized light and/or polarizers, for example on one surface of the device. Such devices also may be relatively complex and costly to construct, and may have a relatively low overall transparency and/or relatively high thickness.

In an embodiment of the invention, a transparent organic light emitting device is provided. The OLED device may include an anode, a cathode, and an organic emissive layer disposed between the anode and the cathode. The organic emissive layer may include a host and a phosphorescent dopant or any other combination of emissive and other materials as previously described herein. The device may also include one or more locally transparent regions, which allows the device to have an overall transparency of 5%, 10%, or more.

Generally, a device as disclosed herein includes one or more emissive regions adjacent to one or more transparent regions. For example, for a full color display, the device may include red, green, and blue OLEDs, such as conventional bottom- or top-emission OLED devices, which are not conventional transparent OLED devices. The emissive OLED devices may be disposed adjacent to one or more regions that have a relatively high degree of transparency, and which may not contain a metallic non-transparent electrode. Devices disclosed herein also may be constructed to emit white light, or to emit monochrome or any other subset of color compared to a full-color display. Similarly, instead of using red, green, and blue emissive regions, devices as disclosed herein may use white emissive devices in conjunction with color filters to achieve visible light of a desired color. OLED devices as disclosed herein include emissive regions with electrodes that are opaque or essentially opaque and therefore prevent transmission through the device, and only emit light through one surface of the OLED devices. When these emissive devices are disposed adjacent to transparent regions that allow transmission through the device, the device may appear transparent when viewed by the human eye while only emitting light in a single direction. For example, a display may be transparent to visible light, while emitting light through a single surface of the display. In some cases, OLEDs and similar devices may emit a relatively small amount of light in directions other than the primary emissive surface or surfaces, such as where a small amount of light may be emitted from the edges of the device. Such light typically may be blocked or masked by, for example, a housing or other component. As used herein, a device is considered to emit light through a single surface or in a single direction if 97%, more preferably 98%, and more preferably 99% of light emitted by the device is emitted through the single surface or in the single direction.

Devices as disclosed herein may be implemented using, for example, a typically metallic cathode deposited through a mask so as not to be disposed over the locally-transparent regions for a bottom-emissive device. As another example, for a top emission device, where the anode is usually reflective, the anode may be patterned so as not to block light through the locally-transparent region or regions. The emissive regions may be driven in any suitable conventional manner, such as using row and column drivers, whereas the locally-transparent region may not be electrically driven.

Figure 3:
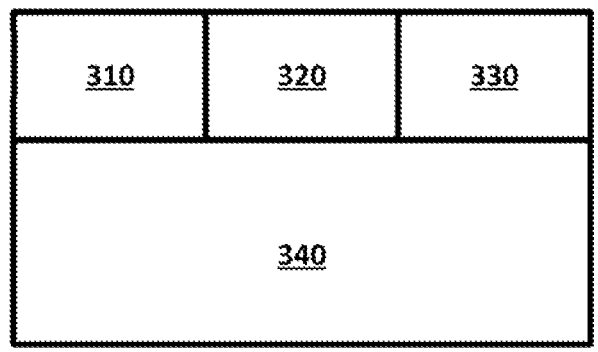
FIG. 3 shows a schematic top view of a region of an example device according to an embodiment of the invention.

FIG. 3 shows a schematic top view of a region of an example device according to an embodiment of the invention. The region shown may be, for example, a portion of a full-color display or other emissive device, such as a general purpose lighting device. The region includes one or more emissive regions 310, 320, 330, which may be red, green, and blue emissive elements, respectively. A second region 340 may be non-emissive but relatively transparent. More specifically, the emissive region or regions 310, 320, 330 may be more opaque than the transparent region 340, such that light is prevented from being transmitted through the device in the emissive regions, but may pass through the transparent region 340. The region and/or the device as a whole may have an overall transparency of at least 5%, at least 10%, or more. That is, at least 5% or more of the light that is incident on either side of the device may be transmitted through the device. The emissive regions 310, 320, 330 prevent light from being transmitted through the device, but emit light through one surface of the device. As used herein, a surface of a device through which light emitted by components of the device is emitted may be referred to as a "light emitting" surface, though the light may be generated by components other than the device such as OLEDs or other emissive components within the device. That is, a "light emitting" surface of a device may not itself be emissive, but may allow light generated within the device to be transmitted through the device to a region external to the device.

The emissive regions 310, 320, 330 may be OLEDs, including AMOLEDs, as described herein. Each region may include a separate OLED, such as where each region is configured to emit a different color of light. Preferably, each OLED is configured to emit light primarily, essentially entirely, or entirely through a single surface of the device. For example, where the device is a full-color flat panel display, the OLEDs may emit light only through the display surface, and not emit light through the back surface of the device. In some configurations, a relatively small amount of light may be emitted through the sides of the device, i.e., parallel to the plane of the device.

By adjusting the relative areas of the device that include emissive regions and transparent regions and the transparency of each transparent region, a desired overall transparency may be achieved. For example, a transparent region may have a local transparency of at least 5%, 10%, 15%, 20%, 25%, 50%, or more. As used herein, a "local transparency" refers to the transparency of only the transparent region considered alone, without regard to the transparency of any other region of the device or the device as a whole. Thus, a region having a local transparency of 25% allows about 25% of incident light to be transmitted through the device, though when considered as a whole the device may allow about 5% or 10% of incident light to be transmitted through the device. The transparency of a device or a region may be determined by measuring the luminosity of visible light incident on the device and the resulting luminosity of light transmitted through the device or region. Since the emissive regions are opaque, a greater area of the device that includes emissive regions leads to a lower overall transparency for the device. In an embodiment, it may be preferred for the emissive regions to extend over not more than about 75% of the total area of the device. This may be higher than conventional displays due to the area usually required by other parts of the pixel that may not be transparent, such as bus lines, TFTs, and the like. Thus, it also may be useful to determine the area that includes emissive regions relative to the area available for emissive regions such as OLEDs in the device, when other components are excluded. In an embodiment, it may be preferred for the emissive regions to occupy at least about 20% of the area available for emissive components in a device such as a display.

Such a configuration allows for an overall transparency of the region or device of at least 5%. Similarly, the greater the area of the transparent region, the greater the overall transparency of the device or region. In an embodiment, it may be preferred for the area not occupied by the emissive region or regions to have a local transparency of at least 25%, 50%, or more. In some configurations, portions of the device that do not include emissive regions also may not be transparent, or may be less transparent than the transparent regions. For example, the device may include a housing, structural supports, circuitry, or other layers or components that are less transparent that the layers and materials in the transparent regions. In an embodiment, at least 70%, 80%, 90%, or more of the area not occupied by an emissive region may have a local transparency of 25%, 50%, or more. Alternatively or in addition, it may be preferred for transparent regions in the device to occupy at least 10% of the total area of the device.

Although described with respect to FIG. 3 as using individual OLEDs of different colors, the configurations disclosed herein also may be used to realize to white-emitting devices that may or may not include a color filter layer disposed over each emissive region or OLED. For example, each of the emissive regions 310, 320, 330 in FIG. 3 may be a white-emitting device, or fewer larger devices may be used. One or more color filters may be disposed between the white-emitting devices and the emissive surface of the device to allow for a colored or full-color display.

As previously described, a variety of substrates and other layers may be used with any embodiment of the invention. For example, a plastic and/or flexible substrate may be used. Flexible and plastic substrates are disclosed herein, and are also described in further detail in U.S. Pat. No. 6,664,173, the disclosure of which is incorporated by reference in its entirety. Similarly, a single layer barrier as disclosed herein may be used as an encapsulation layer of the device.

Figure 4A:
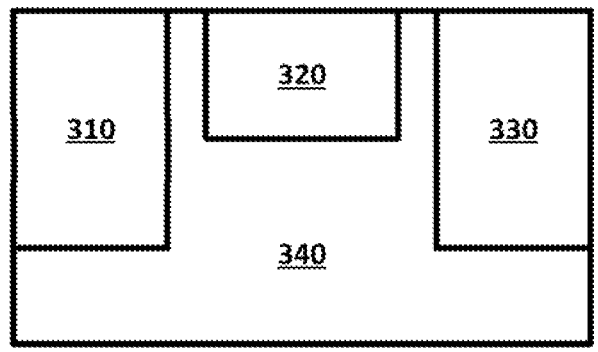
FIG. 4A shows an example arrangement of emissive and transparent regions according to an embodiment of the invention, in which the emissive regions have non-equal areas the transparent region is contiguous.
Figure 4B:
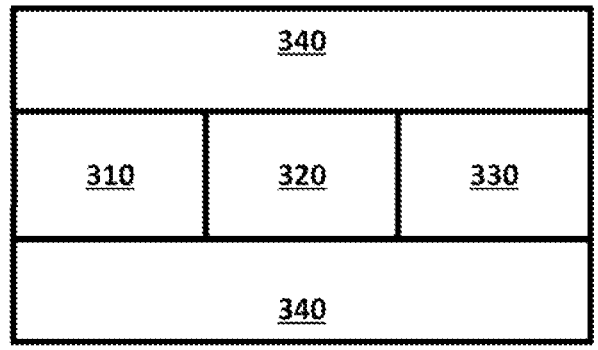
FIG. 4B shows an example arrangement of emissive and transparent regions according to an embodiment of the invention, in which the transparent region is non-contiguous.
Figure 4C:
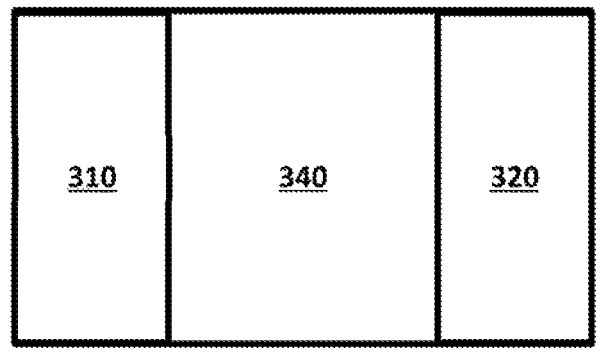
FIG. 4C shows an example arrangement of emissive and transparent regions according to an embodiment of the invention that includes two emissive regions separated by a transparent region.
Figure 4D:
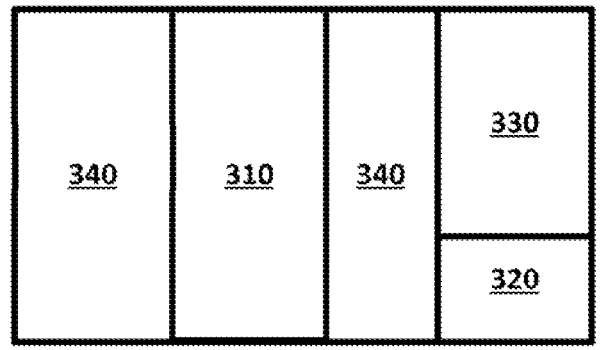
FIG. 4D shows an example arrangement of emissive and transparent regions according to an embodiment of the invention that includes a non-contiguous transparent region and emissive regions with non-equal areas.

FIG. 3 shows an example arrangement of emissive regions and a transparent region. FIGS. 4A-4D show additional examples of such arrangements in accordance with the invention. Notably, a device according to the invention, or a region of such a device, need not have a single contiguous transparent region. Further, the emissive regions need not be immediately adjacent to one another, and need not have equal areas. FIG. 4A shows an example arrangement in which the emissive regions 310, 320, 330 have non-equal areas and in which the transparent region 340 is contiguous. FIG. 4B shows an example arrangement in which the transparent region 340 is non-contiguous. FIG. 4C shows an example arrangement that includes two emissive regions 310, 320 separated by a transparent region 340. FIG. 4D shows an example arrangement with a non-contiguous transparent region and emissive regions 310, 320, 330 with non-equal areas. As is understood in the art, arrangements such as those shown in FIGS. 4A-4D may be used, for example, to adjust the relative emission of differently-colored OLED devices, such as to achieve an overall improved lifetime.

Figure 5:
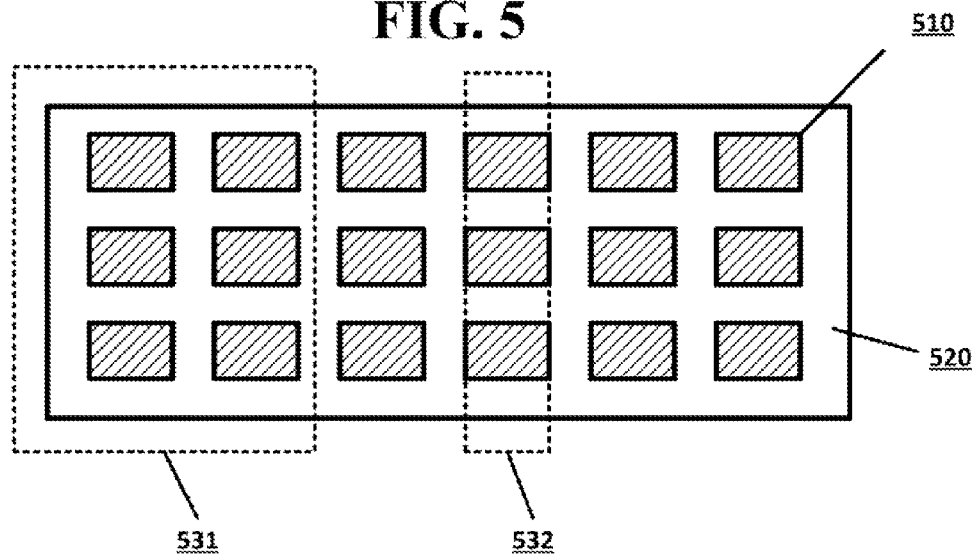
FIG. 5 shows an example device according to an embodiment of the invention that includes multiple emissive regions and a transparent region that surrounds the emissive regions.

FIGS. 3 and 4A-4D show example regions of a device. As will be readily understood by one of skill in the art, these arrangements may be extended to a larger-scale device, such as a general illumination panel, a limited- or full-color display, or the like. FIG. 5 shows an example device having multiple emissive regions 510 and a transparent region 520 that surrounds the emissive regions 510. It will be apparent that, by selecting various regions of the larger region shown in FIG. 5, arrangement such as those described with respect to FIGS. 3 and 4A-4D may be identified. For example, the region 531 includes six emissive regions surrounded by a contiguous transparent region. Similarly, the region 532 includes three emissive regions a non-contiguous transparent region.

Figure 6:
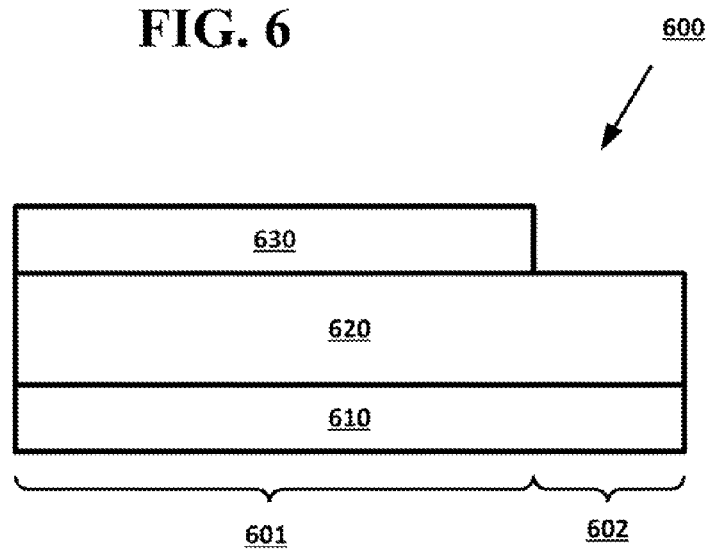
FIG. 6 shows an example of a device according to an embodiment of the invention that includes two electrodes, where one has a surface area less than the surface area of the other.

The emissive regions described with respect to FIGS. 3-5 may comprise one or more OLEDs having various arrangements, and may be fabricated in a variety of ways. In an embodiment, each emissive region may include an OLED, such as an AMOLED. FIG. 6 shows an example of such an OLED 600. The device includes an electrode 610, an emissive layer 620, and an electrode 630 with a surface area less than the surface area of the electrode 610. It may be preferred for the electrode 630 to have a surface area that is not more than about 80% the surface area of the electrode 610. Although FIG. 6 shows an example device having only an emissive layer for ease of illustration, it will be understood that the device may include any of the other layers conventionally used in an OLED, such as the layers described with respect to FIGS. 1 and 2. Further, the device may include additional emissive layers, and may emit a combination of colors or white light. As previously described, the device also may include color filters to allow operation as a white and colored or full-color device. It also may include a single-layer barrier as an encapsulation layer, as well as other suitable coverings, layers, components, and the like.

In operation, the device 600 may emit light from the region of the emissive layer 620 that is disposed between the electrodes 610 and 630. The emissive layer 620, the electrode 610, and other layers disposed between the electrodes 610, 630 may be transparent, preferably at least 25% transparent, while the electrode 630 may be completely or relatively opaque. For example, the electrode 630 may be less than 5% transparent. Thus, an arrangement such as shown in FIG. 6 may provide both an emissive region 601 and a transparent region 602, which may correspond to an emissive region and a transparent region as described with respect to FIGS. 3-5, respectively. In configurations in which electrode 630 is fully opaque, light may be emitted only through the bottom electrode 610 because the emissive OLED will only be formed in the region defined by the overlap of the two electrodes 610 and 630.

Figure 7:
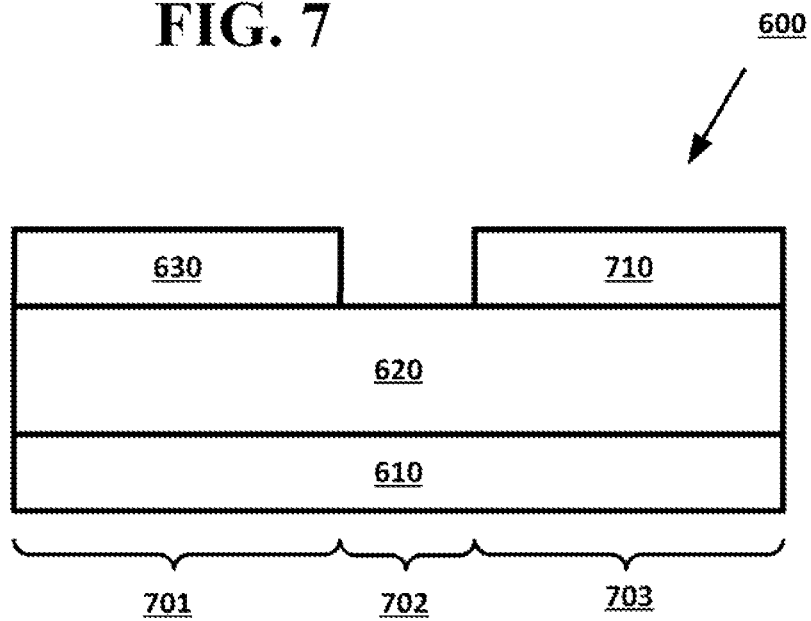
FIG. 7 shows an example of a device according to an embodiment of the invention that includes multiple electrodes, where the combined electrode surface area on one side of the device is less than the surface area of a single electrode on the other side of the device.

FIG. 7 shows a configuration similar to the configuration shown in FIG. 6, that includes multiple electrodes 630, 710 that have a combined surface area less than that of the electrode 610. Such a configuration provides multiple emissive regions 701, 703 and a transparent region 702. The electrodes 630, 710 may be deposited and patterned using any of the patterning techniques disclosed herein.

Figure 8:
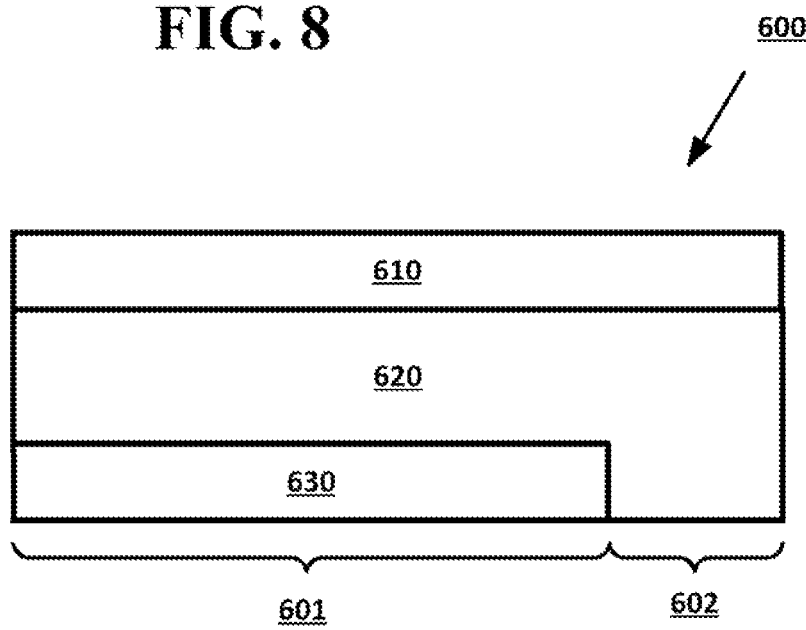
FIG. 8 shows an example device according to an embodiment of the invention in which an emissive layer is disposed over a non-transparent electrode.

FIG. 8 shows an example configuration in which the emissive layer 620 is disposed over the non-transparent electrode 630. As previously described, such a configuration may provide an emissive region 601 and a transparent region 602.

The OLED device arrangements shown in FIGS. 6-8 may be top-emitting or bottom-emitting devices. That is, they may be configured to emit light through only the electrode 610, such as in configurations where the electrode 630 is opaque. As previously described, the device 600 may have an overall transparency of at least 5%, at least 10%, or more, since it includes both a transparent region and one or more non-transparent devices. The layers shown in FIGS. 6-8 may be disposed over any suitable substrate, such as flexible substrates, plastic substrates, and the like, as previously described.

Other configurations may be used to achieve a device having both emissive regions or devices and transparent regions as described. For example, each emissive region may be an individual OLED that is physically separated from some or all of adjacent OLEDs. The OLEDs may be disposed on or within additional transparent layers, such as a substrate, an encapsulation layer, an active or passive backplane, and the like. The additional layers may be at least 5% transparent, thus providing the transparent regions previously described in those regions that do not include an OLED.

Devices as disclosed herein may be fabricated in a variety of ways. For example, referring to FIGS. 6 and 7, the electrode 610, emissive layer 620, and other layers in the device may be deposited using any of the appropriate techniques disclosed herein. The electrode 630 and 710 (if present) may then be deposited over the electrode 610, emissive layer 620, and any other intervening layers, using a mask or other patterning deposition technique. Similarly, referring to FIG. 8, an electrode material, such as an anode material, may be deposited on a substrate to form the electrode 630, such that the deposited material covers only a portion of the substrate. The emissive layer 620, electrode 610, and other intervening layers may be deposited over the same portion of the substrate, as well as at least a portion of the substrate over which the electrode material 630 is not deposited. As previously described, the electrode 610, emissive layer 620, and other layers may be at least 5% transparent or more, thus allowing the region of the completed device that is not disposed over the electrode 630 to be at least 5% transparent.

In some embodiments of the invention, one side of a device may include a display, such as a full-color OLED display, and the other opposite side may include an OLED or similar component that provides illumination. For example, such a configuration may allow the display to provide overlay images to the real world behind the display, such as other embodiments disclosed herein, so that images on the display can be compared to those seen through the display and touch functionality may be used based on the image seen through the display. The addition of illumination on the opposite side of the display may allow such a configuration to be used in environments with relatively low or poor ambient lighting. Such a configuration also may illuminate objects behind the display without providing a source of glare or shadows. As another example, a configuration having opposite-side illumination also may use an illumination source in a non-visible wavelength, which, in conjunction with a camera, can allow for selective low-light or "night" vision through the device. Similarly, such a configuration may allow for an overlay of the infrared or other non-visible wavelength image captured by the camera with the real image seen through the device, to provide a "heads-up" or similar interface and display. As previously disclosed, the display may be touch sensitive, allowing for apparent interaction with items seen in either or both of the real image and the non-visible wavelength image.

More generally, a device as disclosed herein may include a light emitting first device that transmits light through a first region, where a first surface of the device emits light from a second region. The first surface may be, for example, a full-color display, and the second surface may provide, for example, general illumination. A second surface of the device, such as a surface opposite the first surface, also may emit light from the second region, such as where illumination pixels and display pixels are aligned across the device. In some embodiments, the second region may include a single-pixel OLED, and/or the second region may substantially surround at least a portion of the first region. In some embodiments, the device may include a plurality of OLEDs that emit light from the first surface of the second region, and which may only emit light through the second region as previously described. The OLEDs may occupy not more than about 75% of the total area of the display surface. A substantial portion of the display surface, for example at least 70%, which is not occupied by the OLEDs may have a local transparency of at least 25%, 50%, or more.

In an embodiment, the OLEDs that emit light from the first and second surfaces may be independently controllable, and/or emit different spectra. For example, OLEDs that emit from a user-facing surface may be controllable as a full-color display, and OLEDs that emit from an opposite surface may provide general illumination and/or may be controllable as a second, separate full-color display.

The device may have an overall transparency of at least 5%, more preferably at least 10%, as previously described. Similarly, the second region may have a local transparency of less than 5%. The second region may have a local transparency of less than 5%, less than 1%, or any other relatively small transparency relative to other portions of the device. As previously described, devices disclosed herein may be modeled as including multiple regions, each of which includes one or more OLEDs and a transparent region having a local transparency of at least 25% or more.

Devices as disclosed herein also may be used in form factors other than handheld devices. For example, windows incorporating devices disclosed herein may display advertising, information, artwork, or the like on an exterior surface of a building and provide illumination to an interior region, while still allowing a view outside from the interior. As another example, a windshield or window in a vehicle such as an automobile, boat, or the like, may display information on an operator-facing side of the window, while providing external illumination.

In an embodiment, an OLED illumination source may be disposed on a side of a device, such as a mobile device, window, wall, or other device, that is directly opposite an area of an opposite side of the device that provides an active display area. Such a configuration may provide both a display and an illumination source, without decreasing the overall display transparency. For example, a display may emit light from a front-facing side of a device, i.e., toward a user, and an illumination source may emit light from the opposite side of the device, i.e., away from the user.

Conventional transparent displays may have a limitation in that viewers from different sides of the device see different images. For example, an image viewed from one side of the device may be reversed in the horizontal direction when viewed from the other side. This becomes apparent when considering, for example, the situation when one viewer writes text on one side of a transparent sheet, such as a piece of glass or a transparent display, from left to right. A viewer on the same side will see the text as the writer writes it from left to right. However, a viewer on the opposite side will see the text written from right to left, i.e., a reversed image.

In some embodiments of the present invention, a device may display images on both sides of the device, while still being visibly transparent. Notably, the image a viewer sees from one side may be identical to the image a viewer sees from another side. Thus, text viewed from either side will appear in the same direction to viewers on opposite sides of the display.

For example, a device may include a plurality of pixel regions in an active display area. As used herein, an "active display area" refers to, for example, a portion of a display that is capable of emitting light and/or displaying a portion of an image. The "active display area" of a device typically excludes non-emissive and/or non-transparent portions of the display device, such as borders, electrical leads, and the like. For example, a conventional display may have a central region that includes light-emitting portions, surrounded by a border that does not emit light. The central region may be considered an active display area as described herein, whereas the non-emissive border would not be considered an active display area, even if transparent.

Figure 9:
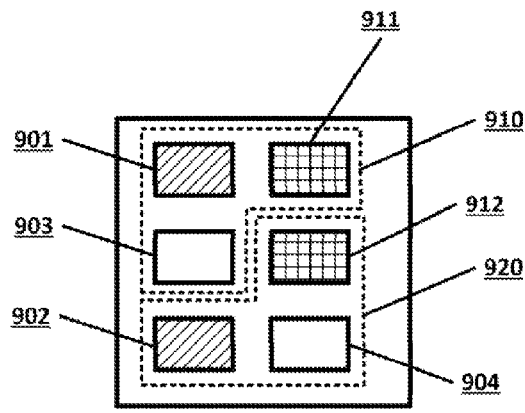
FIG. 9 shows an example portion of a device according to an embodiment of the invention that includes a pixel region with a portion that emits light through a surface of the device and a region that is transparent and does not emit light.

As previously described, each pixel region may include one or more portions that emit light through a surface of the device, as well as one or more regions that are transparent and do not emit light. More specifically, each pixel region may include a first sub-region that emits light through a first surface of the device and a second sub-region that does not emit light and that is at least 5% transparent. The active display area, and/or the display as a whole, also may have an overall transparency of at least 5%. FIG. 9 shows a schematic representation of a portion of such a device. The illustrated display portion includes two pixel regions 910, 920, shown by the dashed lines. Each region includes a first sub-region 901, 902, respectively, that emits light through the visible surface of the display, i.e., out of the page, and a transparent region 903, 904, respectively, that does not emit light.

Each pixel region may include one or more additional sub-regions 911, 912 that is configured to emit light through a second surface of the device, such as through the opposite surface of the visible surface, i.e., into the page. That is, if the display portion shown in FIG. 9 is viewed as showing the front of a double-sided display as disclosed herein, the emissive sub-regions 901, 902 are configured to emit light through the front of the display, and the emissive sub-regions 911, 912 are configured to emit light through the rear surface of the display. Each emissive sub-region 901, 902, 911, 912 may include, for example, one or more pixels, sub-pixels, or the like, each of which may include one or more OLED or similar devices. Further, the display may include an active-matrix OLED (AMOLED) display as described herein. Each OLED may be top- or bottom-emissive as described herein. Generally, the emissive sub-regions are not transparent, i.e., each may have a transparency of less than 5%.

As described in further detail herein, displays such as illustrated in FIG. 9 may be constructed in various ways. In some cases, multiple substrates may be used and aligned to achieve a desired transparency for the overall device. Thus, in some configurations, emissive sub-regions that emit through opposite sides of the device may overlap, as opposed to being completely adjacent to one another as shown in FIG. 9. For example, a front-emissive sub-region 901 may partially or entirely overlap a rear-emissive sub-region 911. Such arrangements may have the benefit of allowing for higher levels of transparency, and/or higher fill factors at the same level of transparency, but also may incur additional fabrication complexity due to the requirement for front- and rear-emissive sub-regions to be aligned.

Each emissive sub-region of the display may include one or more OLEDs. In some configurations, the type of OLED present in an emissive sub-region may be determined based upon which surface the OLED is to emit through. For example, OLEDs configured to emit through a first surface may be top-emissive, while OLEDs configured to emit through the opposite second surface may be bottom-emissive. The OLEDs may be adjacent as shown in FIG. 9, or they may partially or entirely overlap.

In some configurations, two OLEDs may be within the same emissive sub-region and arranged such that one emits through a first surface of the device, and the other emits through the second surface. In such a configuration, the front- and rear-facing OLEDs may overlap to the extent that they may be considered stacked one over the other. A stacked configuration including top- and bottom-emissive OLEDs may be fabricated on a single substrate, or may be constructed from separate devices and/or substrates as disclosed in further detail herein.

Figure 10A:
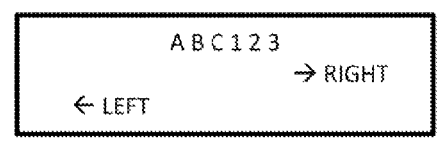
FIG. 10A shows an example image displayed on a first side of a transparent double-sided display according to an embodiment of the invention.
Figure 10B:
FIG. 10B shows the image shown in FIG. 10B as seen from the rear of a transparent double-sided display without the use of rear emissive regions according to an embodiment of the invention.

Arrangements such as illustrated in FIG. 9 and described herein may allow for a display to be a double-sided transparent display. That is, the display illustrated in FIG. 9 may have an overall transparency of at least 5%, while displaying an image from both emissive sides of the device. Further, as disclosed herein, each display may be oriented in the same direction, such that a viewer on each side of the display sees the same image as described herein. For example, the double-sided display may be configured to display a first image on the front, or first surface, and a second image on the rear, or second surface. The second image may be a duplicate of the first image, and displayed without reflection relative to the first image, in contrast to the horizontally-reflected image that would result if, for example, the rear-emissive regions were not used. For example, if the image shown in FIG. 10A is displayed on the first side of a transparent double-sided display, as viewed by a viewer on the first side of the display, the same image shown in FIG. 10A may be displayed on the second side of the display, as viewed by a viewer on the second side of the display. In contrast, without the use of the second-side (rear) emissive regions, the viewer on the second side may be expected to observe an image such as shown in FIG. 10B, i.e., reflected horizontally relative to the image seen by the viewer on the first side.

Figure 11:
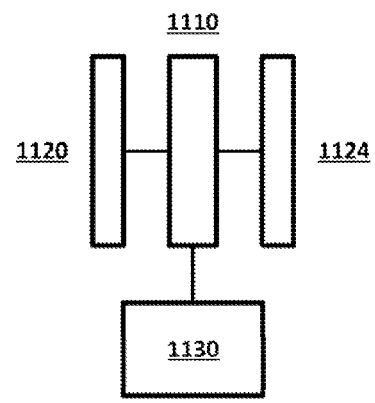
FIG. 11 shows a schematic representation of an example backplane unit configured to drive images on two display surfaces according to an embodiment of the invention.

In an embodiment, one or more backplanes may be used to drive images displayed on display surfaces of a device. FIG. 11 shows a schematic representation of a backplane unit 1110 configured to drive images on two display surfaces 1120, 1124, such as display surfaces on opposite sides of a double-sided display. As previously described, each display surface 1120, 1124 may include portions configured as shown and described with respect to FIG. 9. That is, each display may be a transparent display that includes emissive sub-regions and transparent sub-regions. The backplane unit 1110 may drive each image, for example by providing appropriate instruction to each display. The general operation of a backplane that drives a display will be understood by one of skill in the art. In contrast to conventional backplane displays, the backplane unit 1110 may drive two images, one on each display surface 1120, 1124. The backplane unit 1110 may be a single backplane, or it may be two backplanes operating in concert. For example, a first backplane may drive the display surface 1120, and a second backplane may drive the other surface 1124. As a specific example, a single backplane may be used where both top emission and bottom emission OLEDs have been placed on the same side of a substrate. As disclosed herein, together with the transparent sub-region, this configuration provide 3 sub-regions: sub-region 1 with top-emission OLED emitting light through the first surface; sub-region 2 with bottom emission OLED emitting light through the second surface; and the transparent sub-region 3. In this case, the backplane is a single backplane. This backplane may have circuit to address the two displays separately. It also may have circuits capable of coupling the two displays together. For example, the same image data can be fed into the backplane, and the data will be shown on the two displays sequentially, such as under the control of a switch at the pixel level. Such a configuration also may permit the single backplane to utilize the fast switching nature of the two distinct OLED sub-regions to independently drive unique images on each of the two displays at distinct time allocations, such as to accommodate any reconfigured character representations or unique image attributes for one display relative to the other display.

In some configurations, a controller may be configured to communicate with, and to provide display data to, one or more backplanes 1110. The controller may coordinate and synchronize images provided by each display, such as to provide consistent images in configurations where the images may change based upon user input received via one or more interfaces and associated with each display. For example, each display of the double-sided display may include a user input mechanism such as a touch-sensitive surface. As users on each side of the double-sided display interact with the display, they may provide input that is displayed on the display, such as textual input including handwritten text. The controller may operate to display such input and/or an image on each display, with appropriate modifications so that no input or other information is displayed in a reversed or otherwise reflected orientation. As a specific example, a user may provide text to the double-sided display while interacting with the first side of the display. The controller may receive the input and instruct one or each backplane to display an image that includes the text, oriented in the same place and the same direction on each display.

To do so, the controller may designate a master display between the two displays of the double-sided display. Any content shown on the master display also may be shown on the other, secondary device. In this configuration, communication between the displays may be one way, such that the secondary display does not provide data that is duplicated or otherwise displayed on the master display. In another embodiment, the two devices may have equal status such that only the latest image, which may originate from either display, will be shown on both devices.

For example, a first display of the double-sided display may load a new document page, an image of which is shown on both displays. A first person operating on the side of the first display may write a note on the first display, from left to right as viewed by the first person, such as via a touch screen. As he writes, the notes together with the background document page will be shown on both displays, so that it is seen appearing from left to right to the viewers on each side of the double-sided display. A person operating on the side of the second display may begin writing on the second display, from left to right as viewed by the second person, on top of the notes the first person wrote via the first display. Since now the second display has received the latest information, the controller may take the image resulting from the input received via the second display and show it on both displays. Thus, the first person can see the notes from the second person, appearing from left to right as viewed by the first person. Throughout this communication, the two users can also see each other since the overall device is transparent. One interesting feature is that although the first person can see that the second person is writing from right to left, the display in front of him shows writing from left to right.

In some configurations, it may be desirable for a transparent double-sided display as disclosed herein to display different images on each side. For example, a transparent double-sided display may be used in areas where it may be desirable for the display to physically separate two areas, while allowing for a relatively unobstructed view and providing different information on each side of the display. For example, a transparent double-sided display may separate distinct portions of an airport or similar location, were one side of the display faces a secured or otherwise restricted-access area and the other faces a more generally-accessible area. The display may allow for users in either area to see the other, while providing various information on each side such as security instructions or alerts, flight status, general regional information, or the like. More generally, a transparent double-sided display as disclosed herein may be used to separate any two regions in which some degree of visibility is desired, and/or in which different information is to be provided on each side of the display.

Figure 12:
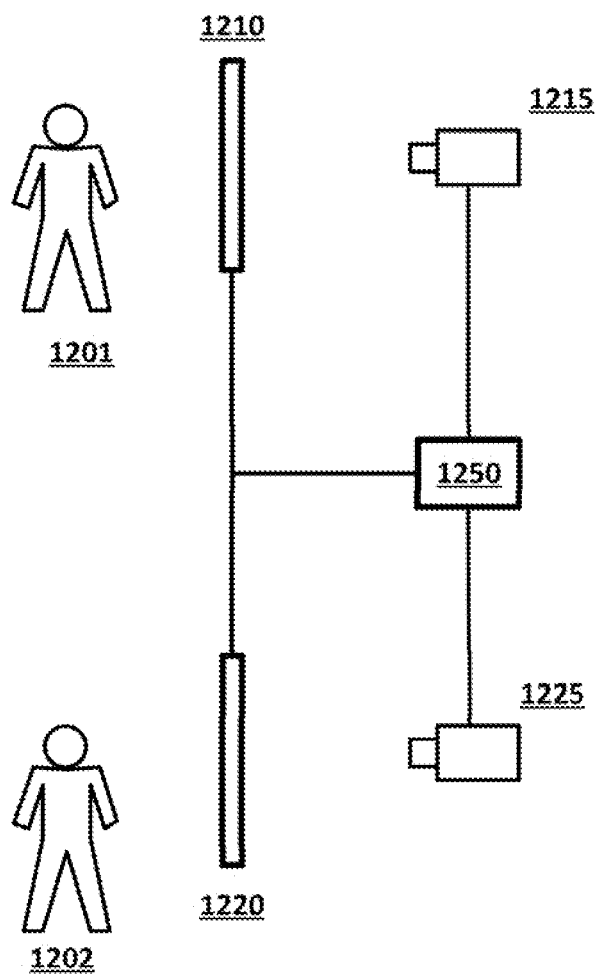
FIG. 12 shows an example system that includes two double-sided displays according to an embodiment of the invention.

In an embodiment, two transparent double-sided displays as disclosed herein may be physically and/or geographically separated from one another, and may operate in concert to display complementary images. FIG. 12 shows an example system that includes two double-sided displays as disclosed herein. Each display 1210, 1220 may operate as previously described. A camera 1215, 1225 disposed opposite the display from a user-accessible side may capture images and/or video of the display, the area beyond the display, or both. Each display may be operable by a user 1201, 1202 as previously described, including operation by, for example, a touch-sensitive surface. Each camera 1215, 1225 may then capture a video showing what would be viewed by a user on the opposite side of the display from the user 1201, 1202, respectively. The video may be transmitted to the other display 1220, 1210, respectively, for display on the side being viewed by the user 1202, 1201. The video may be transmitted over a local area, wide area, or other network, such as the Internet, and may be processed by one or more intermediary computer systems (not shown) as will be readily understood by one of skill in the art. The system may include one or more computer systems 1250, such as a controller associated with each display, that may modify the video captured by the cameras 1215, 1225 and process it before it is provided to the other display. For example, a controller 1250 may reflect some or all of the video, depending upon the effect desired, so that the remote viewer is shown a video in which items opposite the remote screen and/or images displayed on the remote screen are shown with or without reflect. For example, if a first user 1201 writes text left-to-write on the first display 1210, the controller may reflect the provided text and/or the "background" image of the first user 1201 before displaying the resulting video on the second screen 1220. Alternatively or in addition, one or more of the displays 1210, 1220 may operate as a double-sided display as previously disclosed, including a local controller that constructs the image to be shown on the camera-facing side of each display.

Such a configuration may provide both users 1201, 1202, the experience of seeing each other writing on a board, as well as the content of that writing, even when both users are in remote locations. In each case the camera picture may provide the image that each user would see through the display from the other side, i.e., both the user and the shared image, which may be displayed either identical to that seen by the other user or left-right reversed as previously described. The transparent, double-sided display could therefore have an image viewable from either side so left-right inverted, or shown on both sides with an identical image to each user. Thus, the system allows for the camera to capture a realistic image of a user actually interacting with the work surface, in contrast to the image that would result if mounted on the display itself.

It will be understood that the illustrations provided and described herein are not shown to scale, and the specific arrangements shown are not required unless specifically indicated. For example, referring to FIG. 9, the emissive sub-regions 901, 902 may be disposed immediately adjacent to the transparent regions 903, 904. Similarly, the transparent sub-regions 903, 904 and similar sub-regions disclosed herein may not be specifically limited in area as shown. For example, referring to pixel region 901, the transparent sub-region may be the entirety of the region 901 other than the areas identified as emissive regions 901, 911.

As previously disclosed, lighting pixels and display pixels may be disposed on separate substrates, opposite sides of the same substrate, or the same side of the same substrate. For example, a device may include two substrates disposed back-to-back, where the display is disposed on the outward-facing surface of one substrate, and the illumination source on the outward-facing surface of the other substrate. As another example, the display and lighting pixels may be disposed over the same substrate, with one set being configured for top emission and the other for bottom emission. The lighting pixels may be driven at the same luminance, and may include individual sub-pixels that can be independently driven to provide RGB color control. The lighting pixels may be monochrome, white, bottom emission, top emission stacked, and/or single junction devices. More generally, any configuration and combination of OLED pixels as disclosed herein may be used for both the display side and the illumination side of a device.

Devices as disclosed herein may be fabricated with various methods for accurate alignment with the display pixels and easy driving. For example, a lighting device having a display side and an illumination side may be made in a way similar to passive matrix display. Specifically, rows and columns of anodes and cathodes may be disposed in an orthogonal arrangement. Organic layers may be blanket deposited to cover the device. Light may then be generated in the regions where the row and column electrodes overlap. The position of the lighting pixel regions may be aligned with the display pixel by a standard lithography process. As another example, blanket electrodes and organic layers can be used. An insulating layer may be patterned over the regions where no light needs to be generated. Such deposition may be performed using a standard lithography process, printing process and/or other similar processes. As another example, OLEDs may be stacked on same substrate with conductive central electrode (non-transmissive) with a bottom emission light source nearer the substrate and top emission display pixels, or bottom emission OLED pixels, nearer the substrate and top emission light source.

More specifically, double-sided displays as disclosed herein may be fabricated in a variety of ways. In an embodiment, two transparent OLED displays may be coupled back to back. As previously described, each transparent OLED display includes two types of sub-regions: light emitting sub-regions and transparent non-active sub-regions. Typically the emissive sub-regions are preferred to be non-transparent to prevent interference between the two displays. As previously described, such configurations may be realized by using bottom emission and/or top emission OLEDs. The transparent sub-regions typically include no active devices. The sub-regions are at the display pixel level, and together form the basic unit of the display. When the transparent OLED displays are attached, the transparent regions may be partially or entirely aligned so the overall device is transparent. It may be preferred that the two displays have similar or identical shape and size transparent sub-regions so as to maximize the transparency of the resulting double-sided display. However, the individual displays need not have similar or identical transparent sub-region configurations. For example, the two displays may be roughly aligned, and then repositioned as the transparency of the resulting device is measured. When an acceptable, desired, or maximum transparency is obtained, the displays may be connected at the corresponding alignment. For example, the panels may be positioned and repositioned until a transparency over a set threshold is obtained. Such a process may maximize, or achieve a desired level of transparency for the double-sided display.

In an embodiment, a double-sided display may be fabricated using a single substrate instead of back to back panels. In this case, three sub-regions may co-exist on the same substrate: a bottom emission sub-region, a top emission sub-region, and a non-active transparent sub-region as previously described. The bottom emission sub-region emits light in one direction, the top emission sub-region emits light in the opposite direction, and the transparent sub-region provides the transparency for the device. In another embodiment, top emission devices may be placed on top of bottom emission devices as previously described, so as to improve the usage of panel surface area.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A display comprising a plurality of pixel regions in an active display area, each of the plurality of pixel regions comprising:
   a first sub-region configured to emit light through a first surface of the device, wherein the first sub-region is substantially non-transparent, regardless of power being applied to the display; and
   a second sub-region that does not emit light and that is at least 5% transparent, regardless of power being applied to the display;
   wherein the active display area has an overall transparency of at least 5%.

2. The display of claim 1, wherein the display comprises an active-matrix organic light emitting device (AMOLED).

3. The display of claim 1, each of the plurality of pixel regions further comprising:
   a third sub-region configured to emit light through a second surface of the device.

4. The display of claim 3, wherein at least one of the first sub-regions at least partially overlaps at least one of the third sub-regions.

5. The display of claim 3, wherein the display comprises a double-sided display.

6. The display of claim 5, wherein the double-sided display is configured to display a first image on the first surface and a second image on the second surface, wherein the second image is a duplicate of the first image, and the second surface displays the second image without reflection relative to the first surface.

7. The display of claim 6, further comprising:
   a first backplane configured to drive the first surface to display the first image; and
   a second backplane configured to drive the second surface to display the second image.

8. The display of claim 7, further comprising a controller configured to communicate with the first backplane and with the second backplane.

9. The display of claim 8, wherein the controller is configured to select one of the first backplane and the second backplane as a mater display backplane, and, subsequent to selecting the first backplane as the master display backplane, to generate the second image based upon the first image.

10. The display of claim 9, wherein the second image is further based upon a user input received via the first surface.

11. The display of claim 8, wherein the controller is configured to:
receive a user input from an input mechanism associated with the first surface;
generate the second image based upon the user input and the first image; and
provide the second image to the second backplane for display as the second image.

12. The display of claim 11, wherein the input mechanism is a touch-sensitive device.

13. The display of claim 12, wherein the touch-sensitive surface is the first surface.

14. The display of claim 5, wherein the double-sided display is configured to display a first image on the first surface and a second image, different than the first image, on the second surface.

15. The display of claim 6, further comprising:
a first backplane configured to drive the first surface to display the first image, and to drive the second surface to display the second image.

16. The display of claim 15, further comprising a controller configured to communicate with the first backplane.

17. The display of claim 16, wherein the controller is configured to generate the second image based upon the first image.

18. The display of claim 3, wherein each first sub-region comprises a first OLED configured to emit light through the first surface, and each third sub-region comprises a second OLED configured to emit light through the second surface.

19. The display of claim 18, wherein the first OLED is a top-emitting OLED and the second OLED is a bottom-emitting OLED.

20. The display of claim 1, wherein each first sub-region is further configured to emit light through a second surface of the device, the second surface being opposite the first surface.

21. The display of claim 20, wherein each first sub-region comprises two OLEDs, a first of which is configured to emit light through the first surface, and a second of which is configured to emit light through the second surface.

22. The display of claim 21, wherein the first OLED is a top-emitting OLED and the second OLED is a bottom-emitting OLED.

23. The display of claim 1, wherein the display has an overall transparency of at least 10%.

24. The display of claim 1, wherein each second sub-region has an overall transparency of at least 10%.

25. The display of claim 1, further comprising a second plurality of pixel regions, each of which comprises a sub-region configured to emit light through the first surface of the device.

26. The display of claim 1, wherein the display comprises a device selected from the group consisting of: a monitor, a television, a billboard, a heads-up display, a flexible display, a 3D display, a cell phone, a PDA, a laptop computer, a digital camera, a camcorder, a viewfinder, a micro-display, a vehicle screen, a wall, and a sign.

27. A system comprising:
a first display as recited in claim 1,
a camera configured to capture an image displayed on a first side of the first display from a position closer to a second side of the display than to the first side of the display; and
a communication module configured to provide the image captured by the camera to a second display located remotely from the first display.

28. The system of claim 27, further comprising a controller configured to orient the image captured by the camera for viewing by a user of the second display.

29. The system of claim 28, wherein the second display comprises a double-sided display.

\* \* \* \* \*